United States Patent
Duva et al.

[11] Patent Number: 6,058,004
[45] Date of Patent: May 2, 2000

[54] UNITIZED DISCRETE ELECTRONIC COMPONENT ARRAYS

[75] Inventors: Frank A. Duva, Carlsbad; Andre P. Galliath, Newhall, both of Calif.

[73] Assignee: Delaware Capital Formation, Inc., Wilmington, Del.

[21] Appl. No.: 09/056,983

[22] Filed: Apr. 8, 1998

Related U.S. Application Data

[60] Provisional application No. 60/057,783, Sep. 8, 1997, abandoned.

[51] Int. Cl.[7] .............................. H01G 4/31; H05K 1/16; H05K 7/02
[52] U.S. Cl. ...................... 361/301.4; 361/304; 361/328; 361/760; 361/766; 361/807; 361/809; 156/300; 156/303
[58] Field of Search ...................................... 361/728, 729, 361/760, 763, 765, 766, 782, 807, 809, 810, 811, 821, 299.1, 299.3, 301.1, 301.4, 304, 306.2, 313, 321.2, 328–329; 29/25.42; 338/235, 239, 320, 260, 22 R; 174/260; 333/182–185, 172; 336/200, 225; 156/300–303, 295

[56] References Cited

U.S. PATENT DOCUMENTS

| | | | |
|---|---|---|---|
| 2,229,694 | 1/1941 | Ducati | 361/310 |
| 2,830,698 | 4/1958 | Erie et al. | 29/25.42 X |
| 4,223,786 | 9/1980 | Hori | 361/306.2 X |
| 4,499,524 | 2/1985 | Shioleno | 361/782 X |
| 5,239,745 | 8/1993 | Hofsass | 338/22 R X |
| 5,428,499 | 6/1995 | Szerlip et al. | 361/328 |
| 5,493,259 | 2/1996 | Blalock et al. | 333/182 |
| 5,936,840 | 8/1999 | Satwinder | 361/728 |

*Primary Examiner*—Kristine Kincaid
*Assistant Examiner*—Anthony Dinkins
*Attorney, Agent, or Firm*—Christie, Parker & Hale, LLP

[57] ABSTRACT

A unitized discrete electronic component array being surface mountable as a unit on a printed circuit board comprising a plurality of discrete electronic components physically secured to one another by an adhesive. The adhesive is a non-conducting high temperature resistant epoxy, polyimide or glass. The electronic components are capacitors, resistors or inductors, or combinations thereof.

6 Claims, 6 Drawing Sheets

UNITIZED DISCRETE ELECTRONIC COMPONENT ARRAYS

RELATED APPLICATIONS

This application claims priority from U.S. Provisional application Ser. No. 60/057,783 filed Sep. 8, 1997, now abandoned.

BACKGROUND OF THE INVENTION

The present invention relates to surface mount electronic components such as chip capacitors, resistors and inductors. More specifically, the invention concerns arrays of such elements mountable on printed circuit boards with a single placement step and a method for making the arrays.

It is known in the art to configure a plurality of multi-layer ceramic chip capacitors in a monolithic body to allow multiple capacitors to be surface mounted on a printed circuit board in a single placement step. According to known technique, a capacitor array is formed as a monolithic body utilizing a process wherein raw ceramic material of each capacitor is fused together in a high temperature sintering process. Using this technique, it is only possible to test the performance of the individual capacitors once the sintering process is complete and the monolithic body is formed. As a result, if just one of the capacitor elements is found defective, correction requires replacement of the entire capacitor array. This results in significant manufacturing waste and inefficiency.

An additional problem with conventional manufacturing techniques is that it does not readily allow formation of a unitized capacitor array having individual capacitor elements of differing sizes and dielectric materials.

SUMMARY OF THE INVENTION

The present invention addresses the problems associated with prior art techniques. A unitized capacitor array is formed by adhesively bonding together pre-formed individual multi-layer ceramic chip capacitors. According to the invention, the adhesive is preferably a non-conductive high temperature adhesive such as a non-conductive high temperature epoxy, polyimide or glass.

Unitized capacitor arrays in accordance with the present invention can comprise two or more capacitors of equal or different capacitance values. The individual capacitors can exhibit the same or different dielectric constants and other performance characteristics and can have physical dimensions which differ from one capacitor to another within the unitized array.

Unitized capacitor arrays in accordance with the present invention are less expensive to manufacture than the conventional solid block monolithic capacitor design. Each capacitor in the unitized array of the invention can be tested with commercially available equipment before the array is assembled. The inventive process will yield more acceptable finished parts from assembly to final test because assembly of the array will only take place once operability of each of the individual capacitors has been confirmed. This is in contrast to conventional monolithic arrays which must, by design, be tested as a complete multiple unit with one capacitor failure within the array being cause for rejection of the whole assembly. In addition, equipment is not readily available to test individual capacitor elements of different characteristics, such as size, within a conventional type monolithic capacitor array. Thus, specialty equipment must be engineered and built at significant cost if different capacitive elements are to be incorporated.

The process for manufacturing the capacitor array of the present invention comprises loading individual capacitors within a fixture, such as through the use of a linear vibrator; dispensing the epoxy between each individual capacitor through the use of a hand operated epoxy dispenser or an automated epoxy dispenser; curing the epoxy; and unloading the fixture with the finished array.

The invention is not limited to unitized capacitor arrays but applies as well to the manufacturer of unitized arrays of other surface mount components such as chip resistors and inductive elements. The latter may comprise coils formed of interconnected metallized loop patterns printed on multiple chip layers, as is known in the art. The invention also contemplates unitized arrays comprising various combinations of such elements. Generally, such components suitable for use in the invention have a similar rectangular prism shape which facilitate adhesive securement of the components to each other in a side-by-side relation. In addition, the invention also contemplates application to unitized electronic component arrays which are not surface mountable, but can be incorporated within a printed circuit board.

BRIEF DESCRIPTION OF THE DRAWINGS

Other objects and advantages of the invention will become apparent upon reading the following detailed description and upon reference to the drawings, in which.

DETAILED DESCRIPTION

Figure 1:
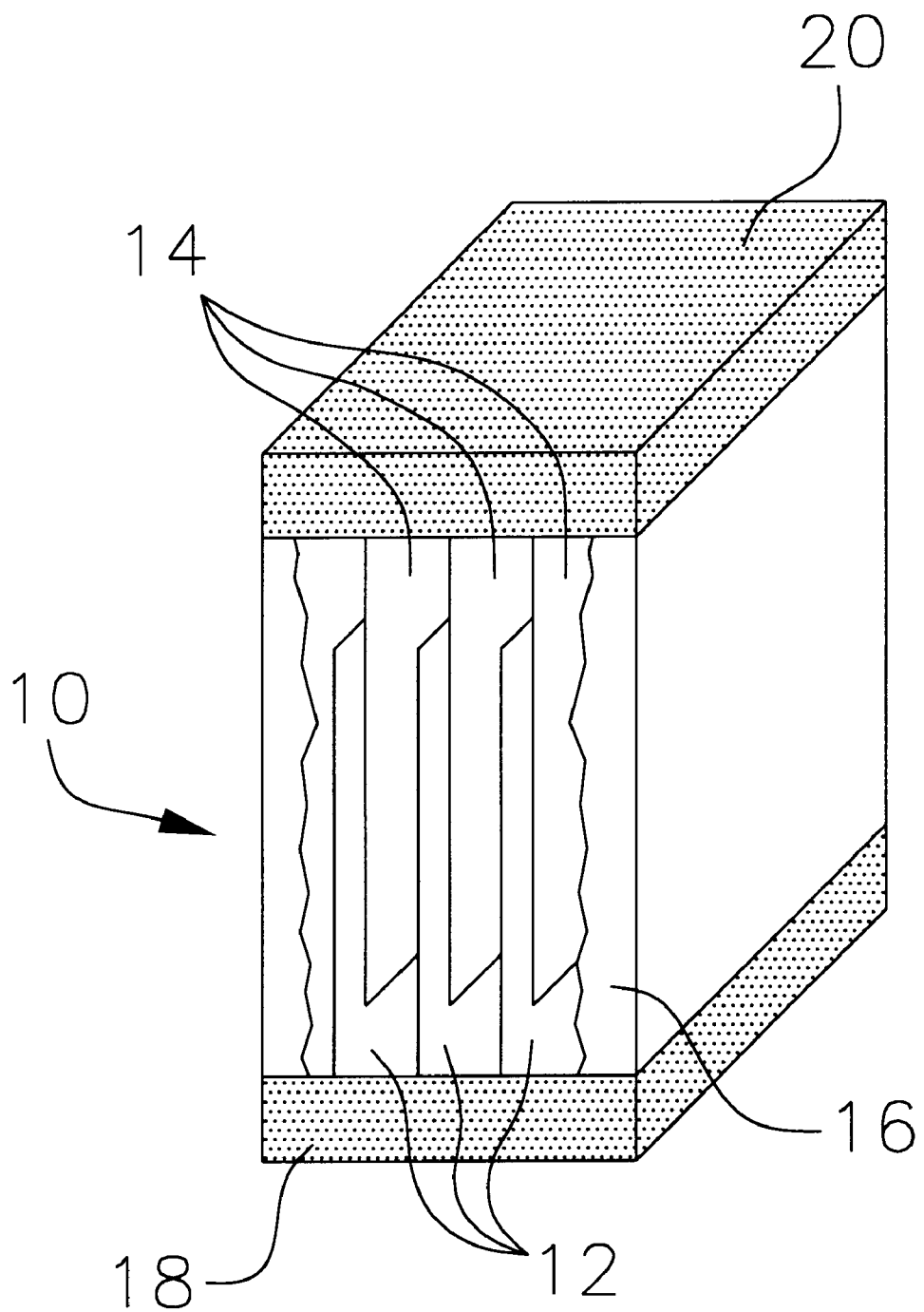
FIG. 1 is a perspective view of an exemplary discrete multi-layered chip capacitor usable in the capacitor arrays of the present invention and shown in cross-section to reveal interleaved capacitor plates embedded in ceramic dielectric material.

A single discrete multi-layer chip capacitor 10 of the present invention is shown in FIG. 1. The capacitor 10 is shown partially broken away to reveal interleaved capacitor plates 12 and 14 embedded in ceramic dielectric material 16 and alternately connected to upper and lower terminations 18 and 20. It is to be understood that the type of capacitor plates, dielectric material, and terminations are selected according to the specific specifications for its application. The capacitor shown is suitable for manufacture of unitized arrays to be discussed in more detail subsequently and is of the type suitable for surface mounting on a printed circuit board. Although FIG. 1 illustrates a capacitor it is to be understood that the invention contemplates the use of other electronic components such as chip resistors and inductive elements to form the arrays. The invention also contemplates arrays utilized within a circuit board other than in a surface mounted fashion. The invention also contemplates unitized arrays comprising various combinations of capacitors, resistors and inductors.

Figure 2:
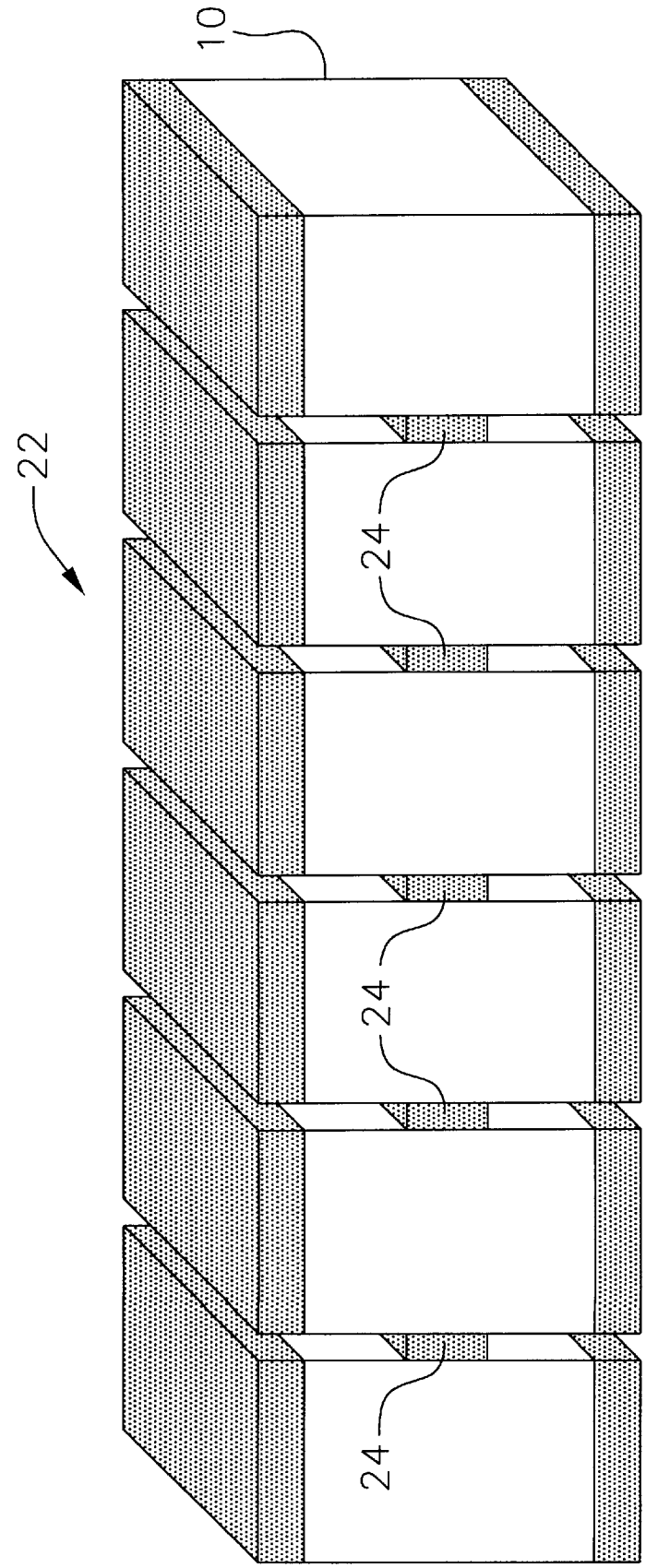
FIG. 2 is a perspective view of a unitized array of the capacitor of FIG. 1.

As can be seen in FIG. 2, a unitized array 22 of capacitors 10 of the type shown in FIG. 1 are secured together in a side-by-side relationship by adhesive dots 24. The array shown in FIG. 2 includes capacitor units 10 formed identically with the same dimensions and same dielectric material.

Figure 3:
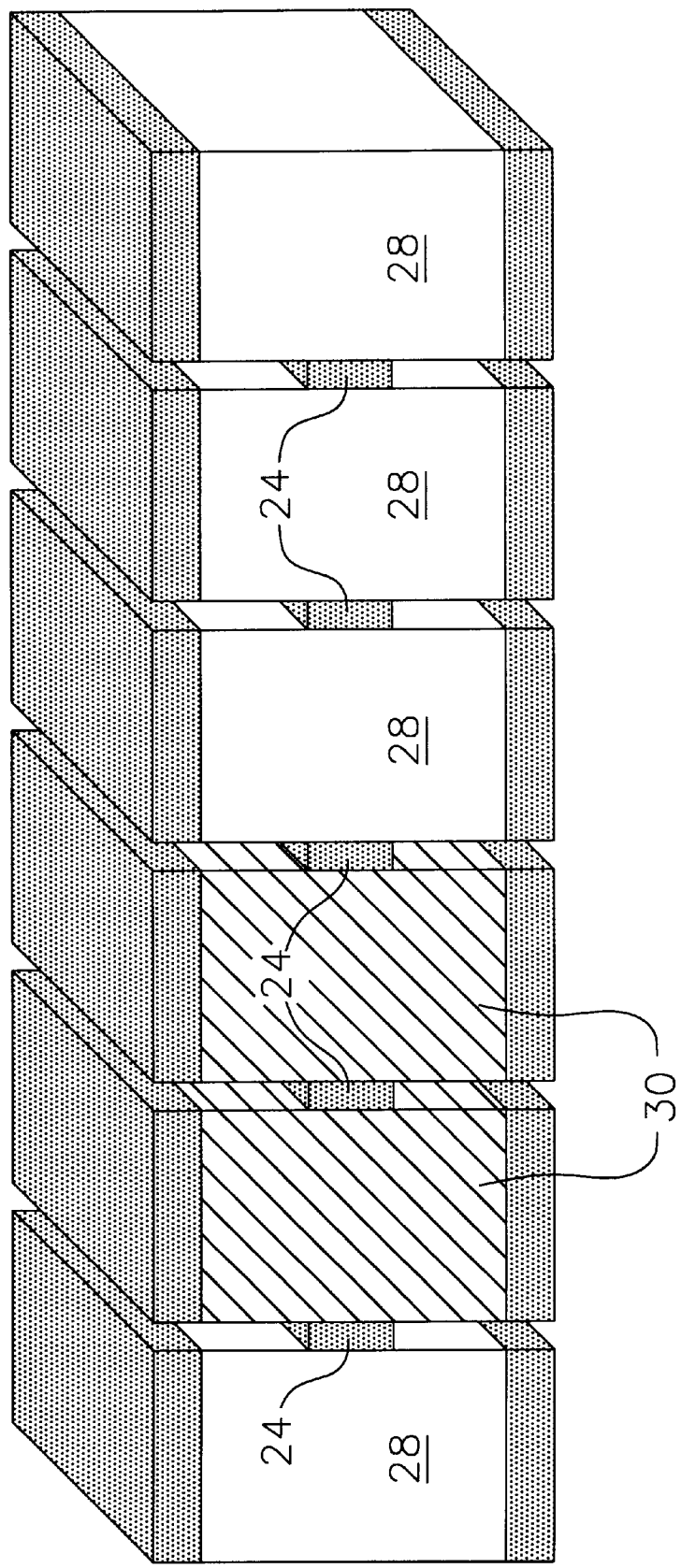
FIG. 3 is a perspective view of a unitized capacitor array wherein the individual capacitors are formed with different dielectric material.

FIG. 3 illustrates a unitized capacitor array 26 formed with capacitors 28 and 30 wherein capacitors 28 and 30 have different dielectric material systems in order to achieve different performance characteristics. Array 26 is formed by securing capacitors 28 and 30 in a side-by-side relation with adhesive dots 24.

Figure 4:
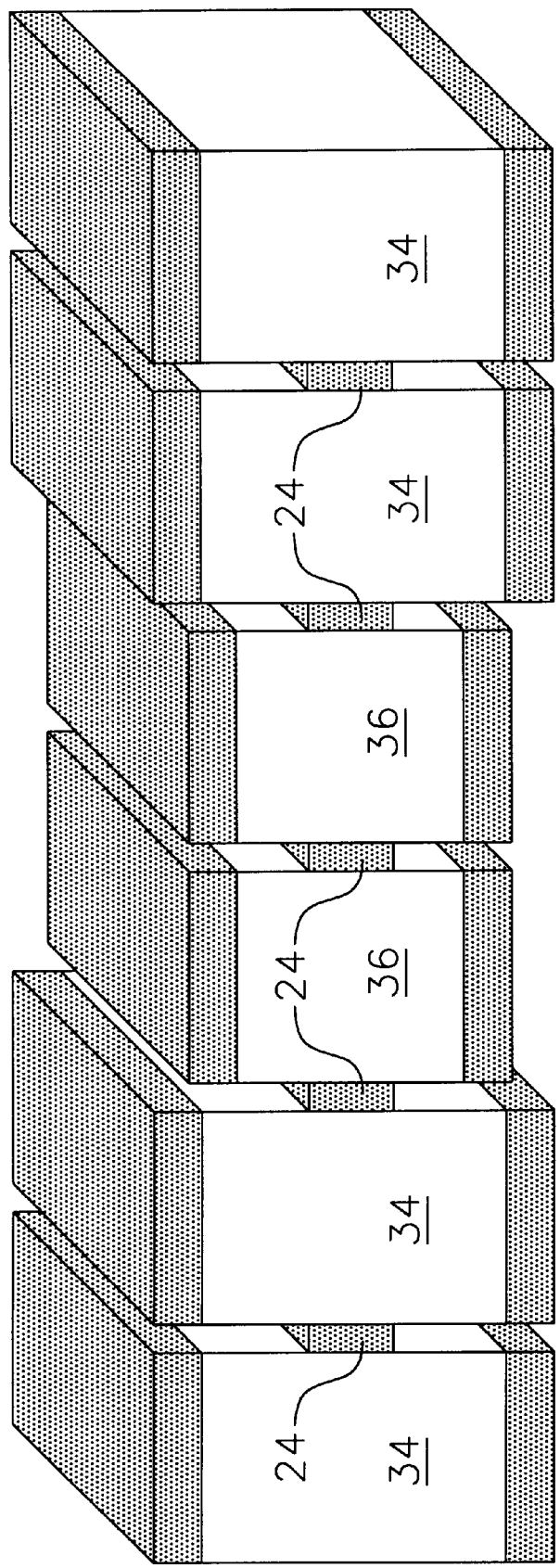
FIG. 4 is a perspective view of a unitized capacitor array wherein the dimensions of the individual capacitors vary.

FIG. 4 illustrates a unitized capacitor array 32 in accordance with the present invention wherein the physical dimensions of capacitors 34 and 36 are different to achieve different performance characteristics. Array 32 is similarly formed by securing capacitors 34 and 36 in a side-by-side relationship by adhesive dots 24.

Figure 5:
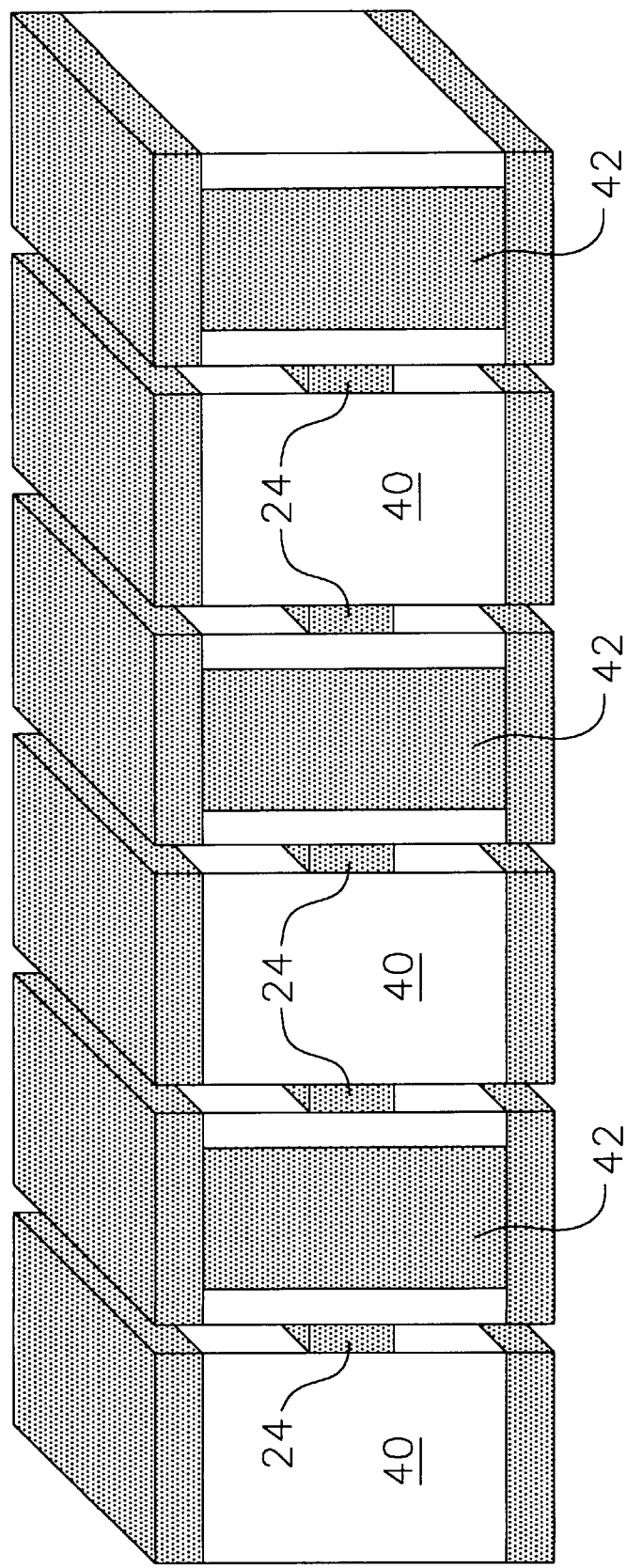
FIG. 5 is a perspective view of a unitized hybrid array of capacitive and resistive elements.

FIG. 5 illustrates a unitized hybrid array 38 of capacitive 40 and resistive 42 elements. Array 38 is formed by securing capacitors 40 and resistors 42 in a side-by-side relation by adhesive dots 24. An array incorporating inductive elements may comprise coils formed of interconnected metallized loop patterns printed on multiple chip layers. Generally, the electronic components of the array suitable for use in the invention have a similar rectangular prism shape which facilitates adhesive securement of the components to each other in a side-by-side relation.

The unitized arrays of the invention are formed by adhesively bonding together pre-formed individual electronic components. The adhesive is preferably a non-conductive high temperature adhesive such as a non-conductive high temperature epoxy, polyimide or glass. A suitable high temperature resistant insulating epoxy is ABLEBOND 77-1S available from Ablestik Company of Rancho Dominguez, Calif. This epoxy is non-sagging when applied and can withstand the high temperatures associated with soldering of the unitized array to a printed circuit board. ABLEBOND 77-1S is a one component, solvent-free insulating epoxy adhesive designed specifically for attaching surface mounted devices to printed circuit boards prior to wave solder. The adhesive should preferably be moisture resistant to eliminate significant electrical leakage after long-term exposure to elevated temperature and high humidity conditions. The adhesive should also preferably have a soft, smooth consistency which permits application through fine diameter needles. The epoxy also should exhibit no tailing or sagging. The bonding of the discrete capacitors to each other is carried out in accordance with the adhesive manufacturers directions for use, and modified as necessary for the particular electronic components comprising the array. The specific type of adhesive chosen can also depend upon the specific performance requirements of the array. Typically epoxy is preferred, however polyimide which is a higher temperature type of epoxy can be used as well as glass which typically requires a firing process.

Figure 6:
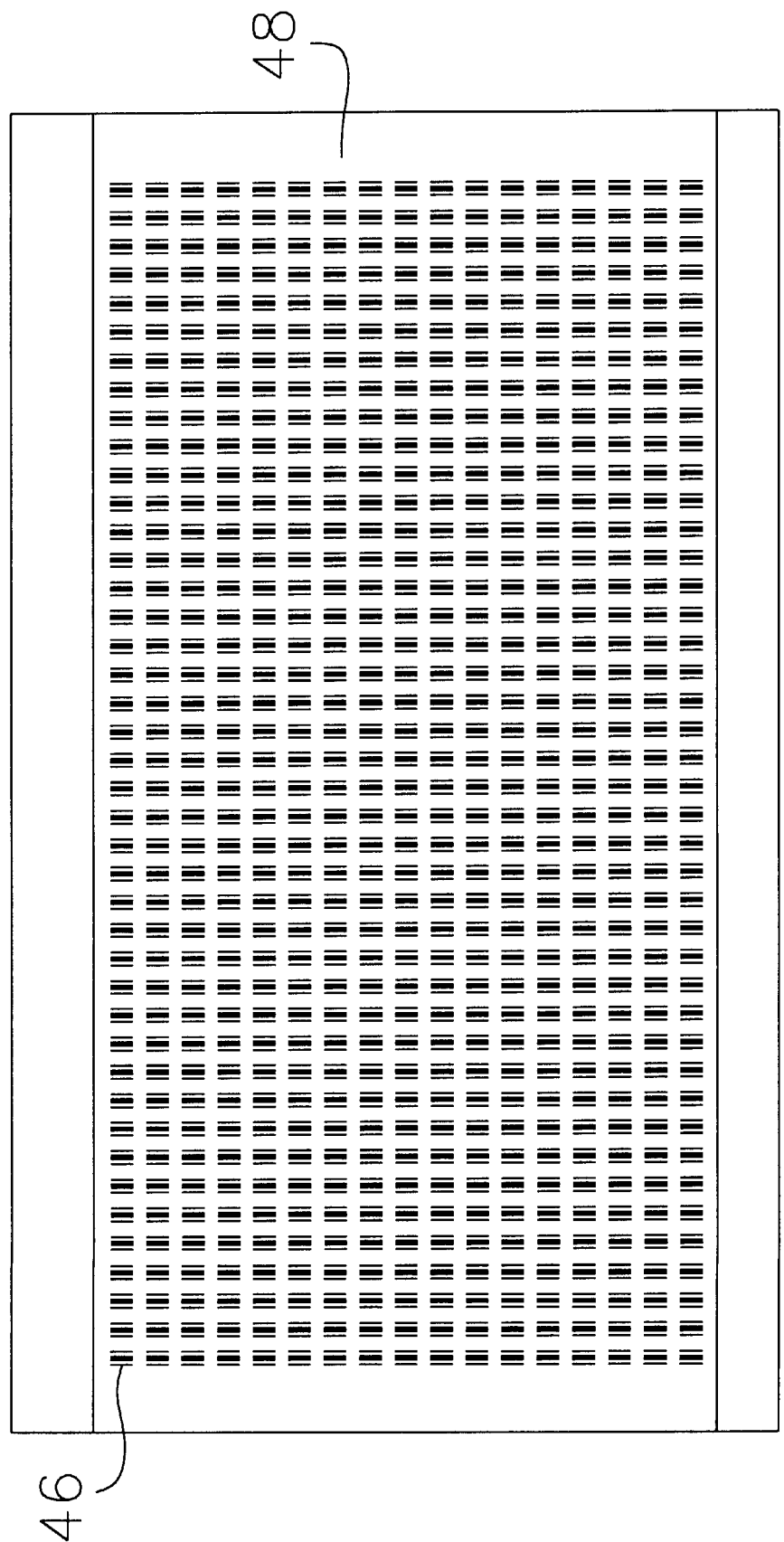
FIG. 6 is a top view of a fixture utilized in forming the array.

The bonding of the individual electronic components to form the array is accomplished through the use of a fixture 44 as shown in FIG. 6. The fixture is a relatively thin board having individual pockets 46 milled into the surface 48 of the fixture to coincide with the dimensions of the electronic component comprising the array. Typically the fixture can be formed from graphite, aluminum or other suitable material and the pockets are typically milled by a CNC milling machine. The pockets 46 are positioned along the fixture as dictated by the performance requirements of the array to be manufactured. The fixture is typically loaded with the individual components by a linear vibrator (not shown). Once the fixture is filled with components the adhesive is dispensed in between each individual component either by a hand operated epoxy dispenser or automatically by a liquid dispensing system. A preferred automated liquid dispensing system is CAM/ALOT Model 1414 or Model 1818 manufactured by Camelot Systems Inc. of Haverhill, Mass.

Although the epoxy is preferably applied as a single dot between the individual electronic components, the adhesive can also be applied in multiple dots or in a layer as required by the specific performance requirements of the array. Once the adhesive is applied it must be cured by typically placing the fixture in an oven at 160° C. for 3 minutes. The curing temperature range and cure times can be varied depending upon the particular adhesive used. Once the adhesive has been cured the fixture is unloaded. The fixture can be unloaded by moving an ejection apparatus having a plurality of ejection pins into contact with the fixture to eject the finished arrays from the fixture.

EXAMPLE

1. SCOPE

This specification covers the characteristics of size 1505, NPO dielectric, 33 pF +/−10% tolerance, 1500 VAC rated ceramic chip capacitors.

2. DIELECTRIC CHARACTERISTICS

| | |
|---|---|
| Operating Temperature Range | −55° C. to 125° C. |
| Temperature Coefficient | 0+/−30 ppm ° C. |
| Dissipation Factor | 0.1% Max @ 25° C. |
| Insulation Resistance @ 25° C. | 100 Giga-Ohms or 1000 Ohms-Farads, whichever is less |
| Insulation Resistance @ 125° C. | 10 Giga Ohms or 100 Ohm-Farads, whichever is less |
| Dielectric Withstanding Voltage | 1500 VAC |
| Aging Rate | 0% per decade hour |
| Test Parameters | 1 MHz, 1.0 Volts +/−0.2 Vrms, 25° C. |
| Assembly Method | Capacitor assembly attachment will use high temperature epoxy |

4. PART NUMBER DESCRIPTION
DR 1505 N 330 K 152 N X T -2

| | |
|---|---|
| DR | = Discrete Array |
| 1505 | = Size |
| N | = NPO Dielectric |
| 330 | = Capacitance Code (pF): Third digit denotes number of zeros |
| K | = Capacitance Tolerance: K = +/−10% |
| 152 | = AC Voltage Rating: third digit denotes number of zeros |
| N | = Termination: Nickel Barrier with 90% Sn-10% Pb overcoat |
| X | = Thickness: Special Thickness .035" +/−.004" (0.89 mm +/−0.10) |
| T | = Packaging: Tape and Reel |
| −2 | = Capacitor Array (second character denotes number of capacitors) |

While the invention has been described in conjunction with a specific embodiment thereof, it is to be evident that many alternatives, modifications, and variations will be apparent to those skilled in the art in light of the foregoing description. Accordingly, it is intended to embrace all such alternatives, modifications and variations as fall within the spirit and broad scope of the appended claims.

What is claimed is:

1. A unitized discrete electronic component array comprising a plurality of discrete electronic components physically secured directly to one another by an adhesive wherein the plurality of electronic components includes at least one resistor.

2. A unitized discrete electronic component array comprising a plurality of discrete electronic components physically secured directly to one another by an adhesive wherein the plurality of electronic components includes at least one inductor.

3. A unitized discrete electronic component array comprising a plurality of discrete electronic components physically secured to one another by an adhesive wherein the adhesive is a non-conducting high temperature resistant epoxy.

4. A unitized discrete electronic component array comprising a plurality of discrete electronic components physically secured to one another by an adhesive wherein the adhesive is a polyimide.

5. A unitized discrete electronic component array comprising a plurality of discrete electronic components physically secured to one another by an adhesive wherein the array includes means for surface mounting the array as a unit on a substrate, wherein the surface mounting means comprises a plurality of pockets in the substrate, each pocket dimensioned to receive one of the discrete electronic components.

6. A unitized discrete electronic component array comprising a plurality of discrete electronic components physically secured to one another by glass.

* * * * *

UNITED STATES PATENT AND TRADEMARK OFFICE
CERTIFICATE OF CORRECTION

PATENT NO.        : 6,058,004
APPLICATION NO.   : 09/056983
DATED             : May 2, 2000
INVENTOR(S)       : Frank A. Duva and Andre P. Galliath Page 1 of 1

It is certified that error appears in the above-identified patent and that said Letters Patent is hereby corrected as shown below:

Column 5, lines 6-10, delete claim 3 in its entirety and insert therefor
-- A unitized discrete electronic component array comprising a plurality of discrete electronic components physically secured directly to one another by an adhesive wherein the adhesive is a non-conducting high temperature resistant epoxy and wherein the electronic components include at least one resistor or inductor. --.

Column 5, lines 11-14, delete claim 4 in its entirety and insert therefor
-- A unitized discrete electronic component array comprising a plurality of discrete electronic components physically secured directly to one another by an adhesive wherein the adhesive is a polyimide and wherein the electronic components include at least one resistor or inductor. --.

Column 6, lines 9-11, delete claim 6 in its entirety and insert therefor
-- A unitized discrete electronic component array comprising a plurality of discrete electronic components physically secured directly to one another by an adhesive wherein the adhesive is a glass and wherein the electronic components include at least one resistor or inductor. --.

Signed and Sealed this

Seventh Day of August, 2007

JON W. DUDAS
*Director of the United States Patent and Trademark Office*